(12) United States Patent
Couch et al.

(10) Patent No.: US 11,624,778 B2
(45) Date of Patent: Apr. 11, 2023

(54) HIGH VOLTAGE INTEGRATED CIRCUIT TESTING INTERFACE ASSEMBLY

(71) Applicant: Texas Instruments Incorporated, Dallas, TX (US)

(72) Inventors: Andrew Patrick Couch, Allen, TX (US); Phillip Marcus Blitz, Garland, TX (US); David Anthony Graham, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 10 days.

(21) Appl. No.: 16/820,544

(22) Filed: Mar. 16, 2020

(65) Prior Publication Data
US 2020/0300909 A1    Sep. 24, 2020

Related U.S. Application Data

(60) Provisional application No. 62/819,862, filed on Mar. 18, 2019.

(51) Int. Cl.
*G01R 31/28*    (2006.01)

(52) U.S. Cl.
CPC ..... *G01R 31/2886* (2013.01); *G01R 31/2853* (2013.01)

(58) Field of Classification Search
CPC .......... G01R 31/2853; G01R 31/2886; G01R 1/0408; G01R 31/2889; G01R 31/2865; G01R 31/2879; G01R 31/2887; G01R 1/00; G01R 3/00; G01R 5/00; G01R 7/00; G01R 9/00; G01R 11/00; G01R 13/00; G01R 15/00; G01R 17/00; G01R 19/00; G01R 21/00; G01R 22/00; G01R 23/00; G01R 25/00; G01R 27/00; G01R 29/00; G01R 31/00; G01R 33/00; G01R 35/00

See application file for complete search history.

(56) References Cited

U.S. PATENT DOCUMENTS

| | | | |
|---|---|---|---|
| 4,607,220 A | 8/1986 | Hollman | |
| 5,198,752 A * | 3/1993 | Miyata | G01R 1/07314 165/80.4 |
| 6,564,986 B1 | 5/2003 | Hsieh | |
| 6,791,176 B2 * | 9/2004 | Mathieu | H01L 21/6835 257/691 |
| 9,667,007 B2 | 5/2017 | Terlizzi et al. | |
| 2016/0293506 A1 * | 10/2016 | Whetsei | G01R 31/2853 |

* cited by examiner

*Primary Examiner* — Lee E Rodak
*Assistant Examiner* — Brent J Andrews
(74) *Attorney, Agent, or Firm* — Ronald O. Neerings; Frank D. Cimino

(57) ABSTRACT

An integrated circuit testing assembly, comprising a slab having a slab axis, and a first electrode and second electrode affixed relative to the slab. The first electrode has a first major axis parallel to the slab axis, is coupled to receive a first voltage for coupling to a first set of pins on an integrated circuit, and includes a first surface area facing the slab axis, wherein the first surface area does not include a surface discontinuity. The second electrode has a second major axis parallel to the slab axis, is coupled to receive a second voltage for coupling to second first set of pins on an integrated circuit, and includes a second surface area facing the slab axis, wherein the second surface area does not include a surface discontinuity.

23 Claims, 13 Drawing Sheets

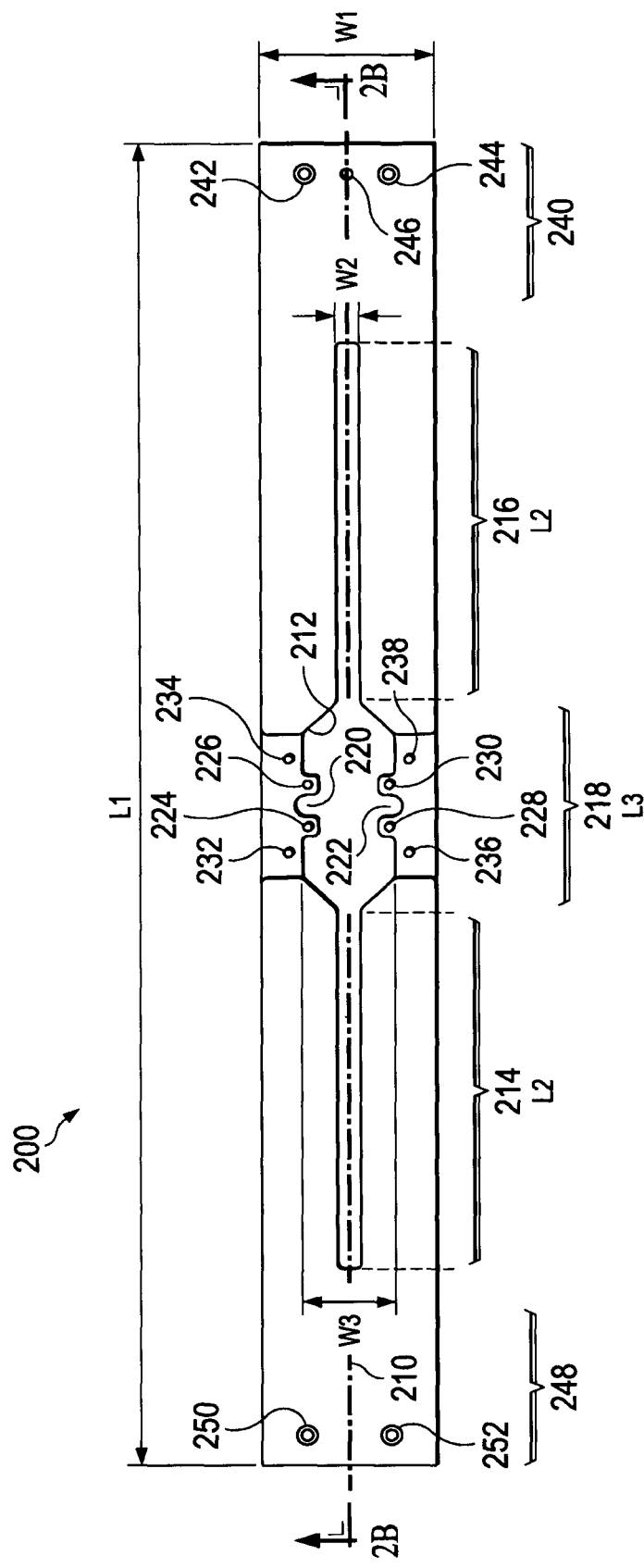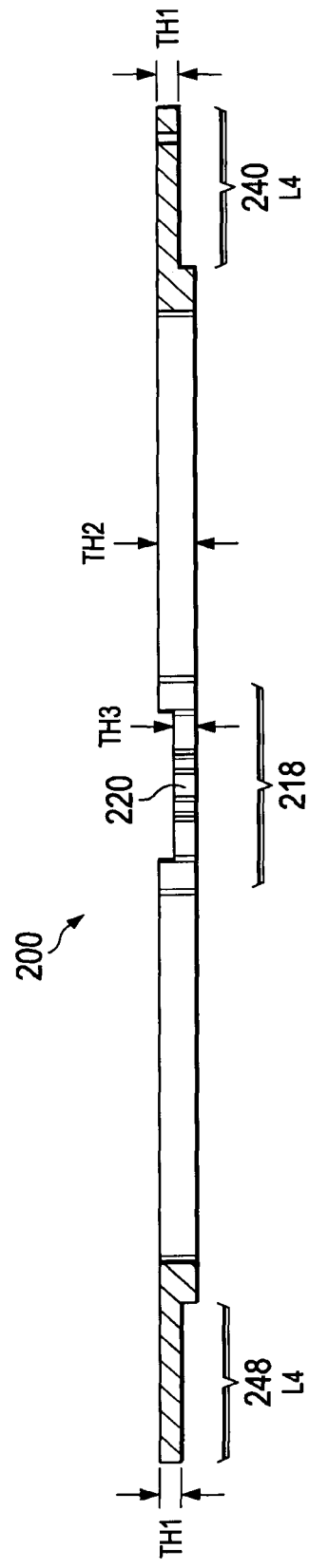
FIG. 2A
FIG. 2B

HIGH VOLTAGE INTEGRATED CIRCUIT TESTING INTERFACE ASSEMBLY

CROSS-REFERENCE TO RELATED APPLICATION

This application claims the benefit of and priority to U.S. Provisional Application No. 62/819,862, filed Mar. 18, 2019, which is hereby fully incorporated herein by reference."

BACKGROUND

The example embodiments relate to integrated circuits (IC singular, ICs plural) and, more particularly, to a high voltage (HV) IC testing interface assembly.

Certain IC devices are tested in relatively high voltage environments, where for example testing voltages can be 1000 $V_{RMS}$ or greater. Isolation ICs are a common example requiring HV testing. An isolation IC typically includes an internal electrical separation between areas inside the IC, which can be within a single or multiple IC package. The isolation is included to prevent current flow between the isolated sections, while often still permitting transmission of an AC signal between the isolated sections. An isolation IC may be used for internal noise suppression or circuitry protection, or for safety purposes to prevent HV injury to someone near a device that includes the IC. Isolation ICs also may be used in various applications, including industrial, building and climate control, security systems, transportation, medical, telecommunications, and others.

Testing of an isolation IC typically involves locating the IC adjacent a HV test board. Prior art test boards are typically fabricated from FR-4 (or FR4), which is a glass-reinforced epoxy laminate material, often used to construct printed circuit boards. Various layers are formed on the FR-4 test board, including the formation from an etched metal layer of a first test electrode and a second test electrode, both at the surface of the test board. For testing, the IC is aligned so that a first set of pins on the IC mutually contact the first test electrode on the test board and a second set of pins on the IC mutually contact the second test electrode on the test board. The IC layout may be designed to position the pins for such testing, for example with the first set of pins along a first side of the IC package and the second set of pins along a second side of the IC package, thereby providing easier alignment to the first and second test electrodes. Often some level of automated equipment aligns the IC (and its electrodes) to the testing board. Thereafter, a high voltage is applied between the first and second test electrodes, with the high voltage usually being a multiplier (e.g., 1.2 to 1.5) of the rated IC voltage performance. Finally, results of the applied voltage can be measured, observed, and/or recorded, to evaluate whether the IC internal barrier withstood the HV test. Failure detection evaluates evaluating whether a current flows between the first and second test electrode, as current flow thereby indicates an isolation breakdown.

While HV design testing is known as described above, test inaccuracies can occur. For example, during HV testing, a non-negligible charge (e.g., current flow) may be detected, presumably indicating an isolation failure. The detected charge, however, may be from design and test vulnerabilities, rather than an internal IC breakdown. One charge moving vulnerability may occur through air, which may include a partial discharge, usually measured in a range of Picocoulombs. Another charge moving vulnerability is a full arc, which usually measures much higher, for example in milliamps to Amps. Such charge moving vulnerabilities also may occur due to the test board design, for example due to the test electrode (or other conductor) proximity and/or geometry. Indeed, it has been observed in connection with example embodiments that the prior art approach of etching electrodes on an FR-4 test board can provide various electrode shapes, depending on the duration of the etch. The cross-section of such shapes, controlled by etch duration, typically can include pronounced electrode edge shapes. Electric field density is higher near such shapes and creates a corona, that is, an area of higher charge that is more susceptible to either partial breakdown or arcing.

Accordingly, example embodiments are provided in this document that may improve on certain of the above concepts, as further detailed below.

SUMMARY

An integrated circuit testing assembly, comprising a slab having a slab axis, and a first electrode and second electrode affixed relative to the slab. The first electrode has a first major axis parallel to the slab axis, is coupled to receive a first voltage for coupling to a first set of pins on an integrated circuit, and includes a first surface area facing the slab axis, wherein the first surface area does not include a surface discontinuity. The second electrode has a second major axis parallel to the slab axis, is coupled to receive a second voltage for coupling to second first set of pins on an integrated circuit, and includes a second surface area facing the slab axis, wherein the second surface area does not include a surface discontinuity.

Other aspects are also disclosed and claimed.

BRIEF DESCRIPTION OF THE DRAWINGS

FIG. 2A illustrates a plan view of one of the four slabs in the FIG. 1A assembly.

FIG. 2B illustrates a cross-sectional view of FIG. 2A.

DETAILED DESCRIPTION

Figure 1A:
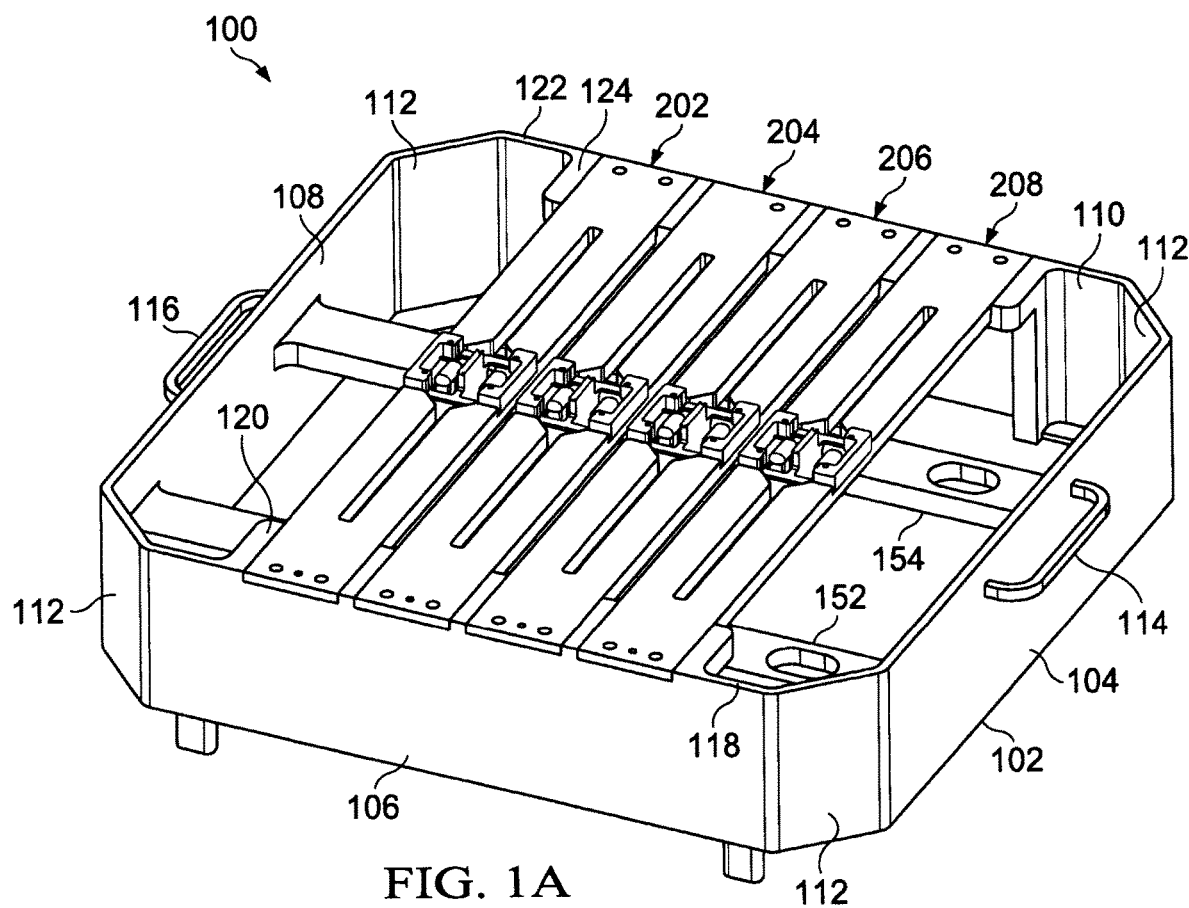
FIG. 1A illustrates a perspective view of a high voltage integrated circuit testing interface assembly.
Figure 1B:
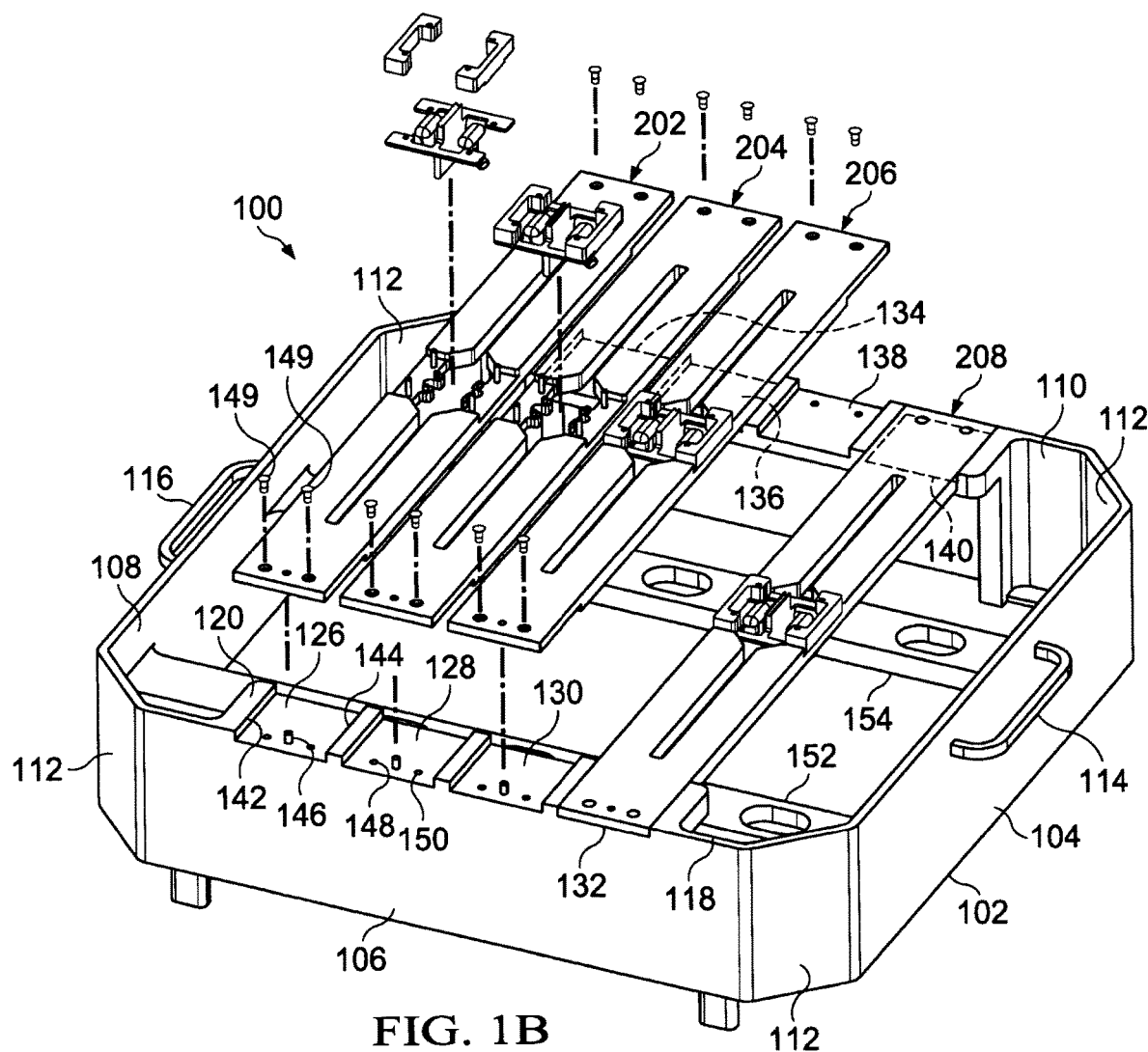
FIG. 1B illustrates a perspective view of a partially exploded view of the FIG. 1A assembly.
Figure 1C:
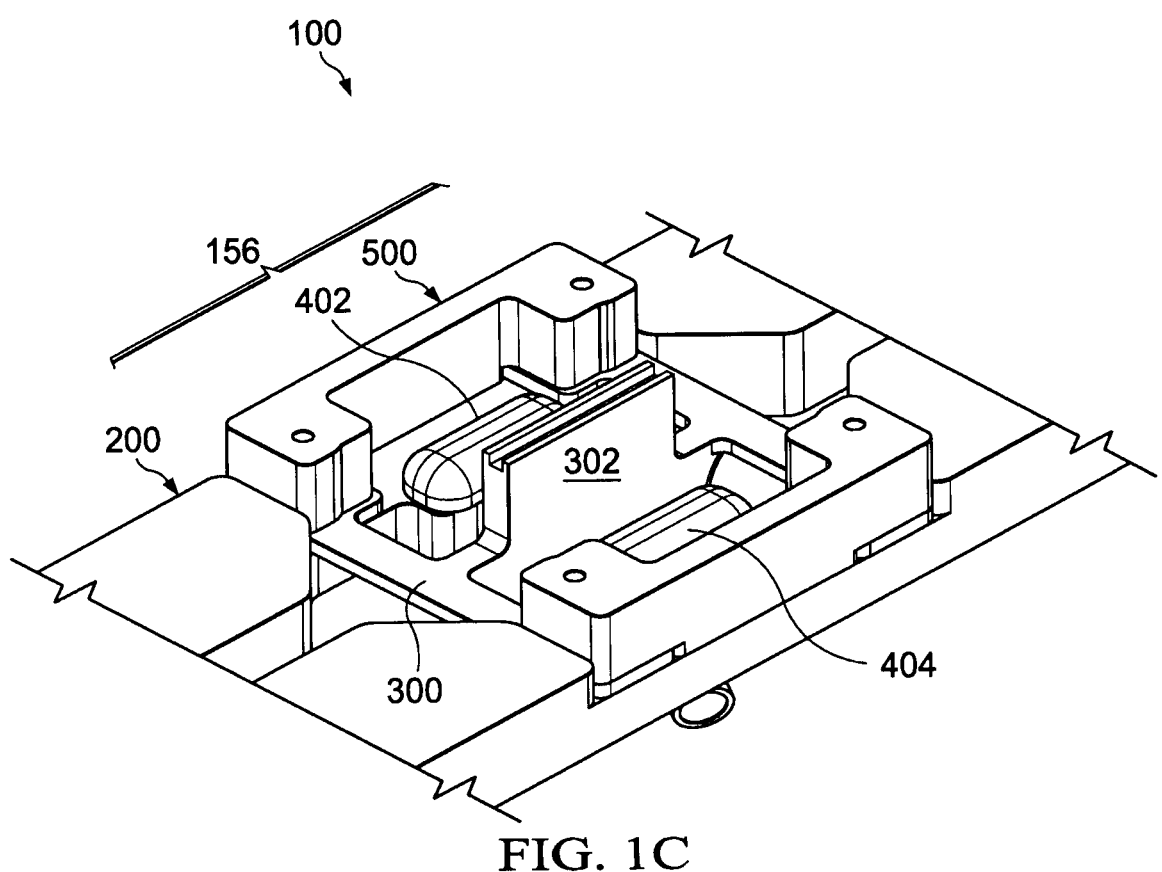
FIG. 1C illustrates a perspective and enlarged view of a portion of the FIG. 1A assembly.
Figure 1D:
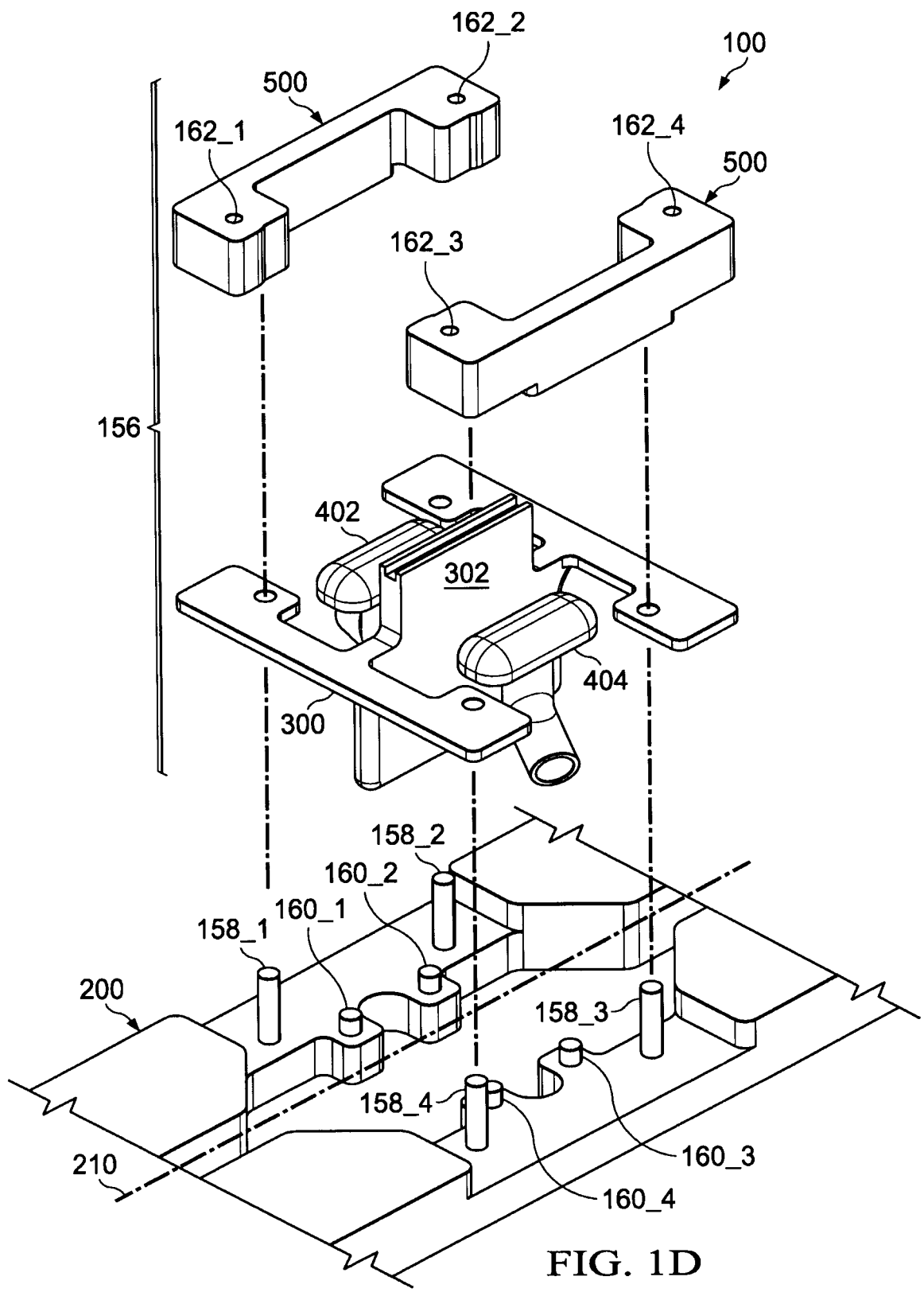
FIG. 1D illustrates a perspective and partially exploded view of a portion of FIG. 1C.

FIG. 1A illustrates a perspective view of a HV integrated circuit testing interface assembly 100. FIG. 1B illustrates a perspective and partially exploded view of assembly 100. FIG. 1C illustrates a perspective and enlarged view of a portion of assembly 100. FIG. 1D illustrates a perspective, enlarged, and partially exploded view of a portion of assembly 100. The following discussion generally introduces aspects of assembly 100 with respect to all of FIGS. 1A-1D, with additional details in later drawings and description. Additionally, for sake of reference, the perspective of top and bottom as shown in FIG. 1A is used throughout this document, only as a basis of reference as assembly 100 may be manipulated to any of different orientations.

Portions of assembly 100 are first discussed mostly with reference to FIGS. 1A and 1B. Assembly 100 includes a frame 102, formed from a rigid material such as metal, and that presents a general perimeter of assembly 100 and support for other of its components. The outer shape of frame 102 includes four sidewalls 104, 106, 108, and 110, presenting a generally square or rectangular perimeter, for example of equal side length of 16.75 inches. Also as illustrated, frame 102 may include angled corners 112. Assembly 100 also includes handles 114 and 116, each projecting outwardly from a respective one of sidewalls 104 and 108. Handles 114 and 116 permit handling and manipulation of assembly 100 with respect to other structures, such as related testing equipment that may align ICs with assembly 100, as further detailed later. An upper edge 118 of sidewall 106 includes a cantilevered inwardly-extending first shelf 120, and an upper edge 122 of sidewall 110 includes a cantilevered inwardly-extending second shelf 124. First shelf 120 includes four equally-dimensioned recesses 126, 128, 130, and 132 (some more readily viewable in FIG. 1B), and in opposing and respective positions, second shelf 124 includes four equally-dimensioned recesses 134, 136, 138, and 140. Each recess pairing supports opposing ends of a respective slab in the form of a slab 200, described in more detail in FIGS. 2A-2B. Accordingly, as shown in FIGS. 1A-1B, a pair of recesses 126 and 134 supports a slab 202, a pair of recesses 128 and 136 supports a slab 204, pair of recesses 130 and 138 supports a slab 206, and a pair of recesses 132 and 140 supports a slab 208. Each recess can provide slab support in various manners; for example, as numbered by illustration for recess 126, it includes support sidewalls 142 and 144, a retention pin 146 centered between support sidewalls 142 and 144, and threaded screw holes 148 and 150 symmetrically spaced between respective support sidewalls 142 and 144, and relative to retention pin 146. Assembly 100 also includes a first and second internal lateral member 152 and 154, each positioned between opposing sidewalls 104 and 108. Each of first and second internal lateral members 152 and 154 provides a physical support to which a respective HV cable (not shown) can be connected, for example by mounting the cable through the oval aperture shown in each respective member.

Additional portions of assembly 100 are now discussed, mostly with reference to FIGS. 1C and 1D. Each slab 200 supports an IC landing area 156, that is, a test site location where an IC (not shown) is positioned relative to various physical and electrical structure, and for testing the positioned IC. Landing area 156 includes three generally separate sets of structure, each of which is described below.

Landing area 156 includes an ultra high voltage (UHV) leadbacker 300, detailed later in FIGS. 3A-3C, affixed to slab 200. The affixation may be by mechanical fasteners, for example, by screws 158_1, 158_2, 158_3, and 158_4, each of which fits into a respective counterbore on the underside (not shown) of slab 200, with each counterbore capturing a screw head and the respective screw threaded portion extending through slab 200 and engaging with threads (not shown) in a respective one of holes 318, 320, 322, and 324 of UHV leadbacker 300 (see FIG. 3A). Alternatively as detailed below, threads may be eliminated in those holes of UHV leadbacker 300, as retention force may be provided by the screws passing through UHV leadbacker 300 and threading into an additional structure. As introduction, UHV leadbacker 300 provides general structural support to landing area 156. UHV leadbacker 300 also may support and include a vertical charge separation wall 302, which can extend either or both of above or below slab 200, between first and second electrodes 402 and 404, as further detailed later.

Landing area 156 also includes a first electrode 402 and a second electrode 404, detailed later in FIGS. 4A-4D, affixed relative to a same surface of slab 200, where in the perspective of FIG. 1D that is the upper surface of slab 200. The electrode affixation orients the major axis (axis along the longest length, see FIG. 4A, majority axis 432) of each electrode parallel to the major axis of the other electrode and to the major axis of slab 200 (see FIG. 2A, longitudinal slab axis 210). The affixation may be by mechanical fasteners, for example, by screws 160_1, 160_2, 160_3, and 160_4, each of which fits into a respective counterbore on the underside (not shown) of slab 200, with the respective counterbore capturing the screw head and the screw threaded portion extending through slab 200 and engaging with threads (not shown) in respective holes 414 and 416 (see FIG. 4B) on the underside of one of first and second electrodes 402 and 404. Functionally, electrode 402 provides contact, akin to a pogo pin, to physically and electrically contact and communicate signals (e.g., a first voltage) to a first set of pins on an IC, while similarly electrode 404 provides contact, again akin to a pogo pin, to physically and electrically contact and communicate signals (e.g., a second voltage) to a second set of pins on an IC. Accordingly and as detailed later, a high differential voltage may be placed between first and second electrodes 402 and 404, for purposes of HV testing the IC. As also detailed below, various aspects are including to reduce the possibility of partial discharge or arcing between first and second electrodes 402 and 404, as well as between other components of assembly 100.

Landing area 156 also includes a two-piece UHV contactor shim 500, shown as a first piece 502 and a second piece 504 later in FIGS. 5A-5C, affixed relative to slab 200, for example by affixing UHV contactor shim 500 to UHV leadbacker 300. In an example embodiment, the same screws 158_1, 158_2, 158_3, and 158_4 that fit within respective holes (threaded or not threaded) of UHV leadbacker 300 may fit within respective threaded holes on the opposing surface of UHV contactor shim 500 (not shown in FIG. 1D, but shown in the lower surface of FIG. 5C, as holes 506_1, 506_2, 506_3, and 506_4). In this regard, as each screw is tightened to draw UHV contactor shim 500 toward slab 200, then UHV contactor shim 500 will provide a compressive retaining force against an upper surface of UHV leadbacker 300, thereby further retaining it in place, in addition to any retention provided by the screws passing through holes in UHV leadbacker 300. Functionally, UHV contactor shim 500 provides a spacer and fitment functionality, so that an IC may be brought to landing area 156 by additional tester apparatus, such as a so-called handler. The handler engages and abuts UHV contactor shim 500, and such engagement lands the IC into landing area 156, so that one set of the IC pins engages first electrode 402, while another set of the IC pins engages second electrode 404.

Further in this regard, UHV contactor shim 500 includes holes 162_1 and 162_2 in a first piece of the two-piece member, and holes 162_3 and 162_4 in a second piece of the two-piece member. Accordingly, as a handler brings an IC into contact with landing area 156, each of holes 162_1, 162_2, 162_3, and 162_4 receives either a respective pin or screw from the handler, thereby properly aligning and affixing the to-be-tested IC relative to the components in landing area 156.

FIG. 2A illustrates a plan top view of a slab 200, which represents any of the four slabs 202, 204, 206, and 208 in assembly 100 of FIGS. 1A-1D. Slab 200 may be formed from various materials, with varying considerations in material selection. For example, slab 200 may be constructed from polyether ether ketone (PEEK), which has favorable insulating, mechanical, and chemical resistance properties that withstand high temperature. As another example, slab 200 may be constructed from acetal homopolymer, offered for example under the trademark brand of DELRIN, which is a crystalline plastic that also has favorable insulating and manufacturing properties (e.g., softness and availability in large sheets). As still another example, slab 200 may be constructed from TORLON, which is a trademark branded non-crystalline thermoplastic that also has favorable insulating and manufacturing properties (e.g., softness), but a drawback can be its lesser performance at high temperature. Lastly, slab 200 may be constructed from FR4, but while FR4 provides beneficial insulating properties, a drawback is that it may include micro voids, which can produce fall testing signals (e.g., false fails, indicating an IC partial discharge or arc, when in fact the IC has not so failed).

From the plan view of FIG. 2A, slab 200 is generally rectangular, for example having a length L1=16.750 inches, a width W1=2.0 inches. An imaginary longitudinal slab axis 210, along the slab major axis, is shown bisecting slab 200. Slab 200 includes a longitudinal aperture 212, which is symmetric above and below longitudinal slab axis 210. Aperture 212 includes first and second outer narrow portions 214 and 216, with a central wider portion 218 between first and second outer narrow portions 214 and 216. The total length of first and second outer narrow portions 214 and 216, plus central wider portion 218, is L2+L2+L3=11.75 inches. The length L2 of first and second outer narrow portions 214 and 216 are the same (or approximately the same), with L2=4.5 inches. The length L3 of central wider portion 218 is L3=2.7 inches. The width W2 of first and second outer narrow portions 214 and 216 are the same (or approximately the same), with W2=0.25 inches. The width W3 of central wider portion 218 is approximately W3=1.08 inches. Central wider portion 218 also includes a first cutout 220 and a second cutout 222 formed in slab 200, opposing one another and relative to slab axis 210, where each of first and second cutouts 220 and 222 has a partially circular perimeter. As detailed below, each of first and second cutouts 220 and 222 provides an area through which a portion of a respective one of either first electrode 402 or second electrode 404 (FIG. 1D) passes through the planar area defined by slab 200. A pair of holes 224 and 226 are proximate first cutout 220, and a pair of holes 228 and 230 are proximate second cutout 222. As introduced above (FIG. 1D), screws 160_1 and 160_2, or screws 160_3 and 160_4, pass through counterbores in the underside of slab 200 into the underside of first and second electrodes 402 and 404, and note now that each such screw passes through a respective one of holes 224, 226, 228, and 230. Also on one side of central wider portion 218 and the outer width W1 of slab 200 are located a pair of holes 232 and 234, and on the opposing side of central wider portion 218 and the outer width W1 of slab 200 are located a pair of holes 236 and 238. As also introduced above (FIG. 1D), screws 158_1, 158_2, 158_3, and 158_4 pass through counterbores on the underside of slab 200 and engage (through UHV leadbacker 300) with threaded holes on shim 500, and note now that each such screw passes through a respective one of holes 232, 234, 236, and 238. Lastly, each distal end of slab 200 includes a number of holes for assisting with affixation of slab 200 to frame 102. Specifically, a first slab distal end 240 includes two screw holes 242 and 244 and a pin-receiving hole 246. A second slab distal end 248 includes two screw holes 250 and 252. Each of screw holes 242, 244, 250, and 252 aligns with a respective recess hole in one of two opposing recesses in frame 102. For example in FIG. 1B and in connection with recess 126, screw hole 242 aligns with recess hole 150, screw hole 244 aligns with recess hole 148, and with screw holes 250 and 252 aligning with respective recess holes (not shown) in recess 134, then a respective screw (not shown) is threaded through each of the aligned holes and into frame 102. Also in the example embodiment, each slab has a single pin-receiving hole 246 at only one of the two distal slab ends. Accordingly, that pin-receiving hole aligns with a single respective recess pin (e.g., pin 146, FIG. 1B) in only one of the two opposite-positioned recesses, so that the appropriate slab distal end is installed into the correct corresponding recess, that is, to prevent the slab from being mistakenly rotated 180 degrees and erroneously mounted to frame 102.

FIG. 2B illustrates a cross-sectional view of FIG. 2A. The cross-sectional thickness, shown in the vertical dimension in FIG. 2B, varies in different longitudinal locations of slab 200, with its thickest to be approximately 0.45 inches and at its thinnest to be approximately 0.188 inches. The cross-sectional view demonstrates that first and second slab distal ends 240 and 248 have a first thickness TH1 that is less than a second thickness TH2 in areas of slab 200 inward from those ends, where TH1=0.188 inches and TH2=0.444 inches. Additionally, the length L4 of each of first and second slab distal ends 240 and 248 is L4=2.0 inches. Accordingly, each of first and second slab distal ends 240 and 248 is configured to fit within a respective one of the pairs of opposing recesses in FIG. 1B, such as recess pair 126 and 134, recess pair 128 and 136, recess pair 130 and 138, or recess pair 132 and 140. Slab 200, in the vicinity of central area 218, has a thickness TH3=0.251 inches, thinner than the maximum thickness TH2 of slab 200 and so that a recess is formed at the top of slab 200, in the vicinity of central area 218, in which various components described herein fit to construct landing area 156 (see FIG. 1C). This recess may facilitate alignment both during setup and also with current design standards, that is, to avoid a need for modification to other mating apparatus.

Figure 3A:
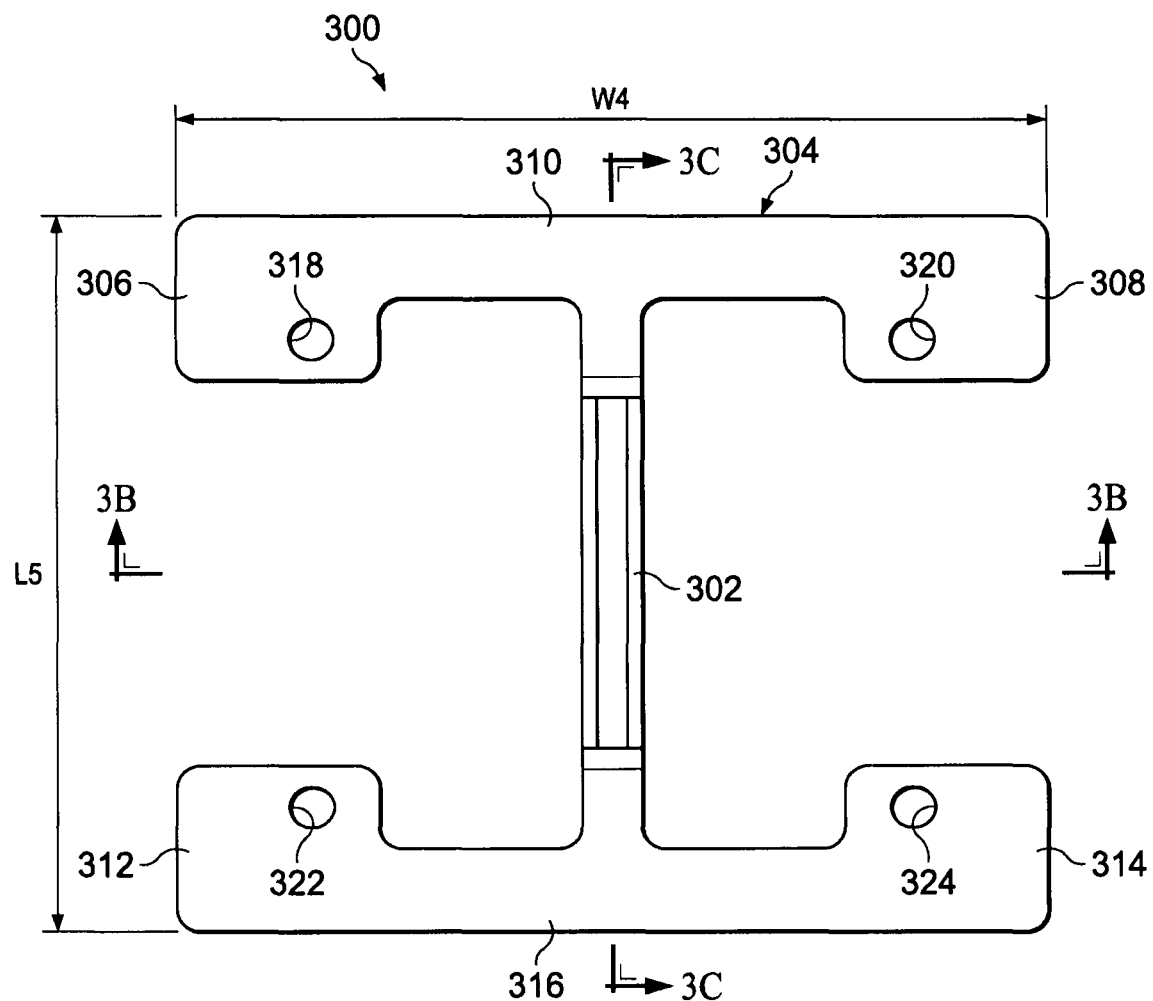
FIG. 3A illustrates a plan top view of a UHV leadbacker in the FIG. 1A assembly.
Figure 3B:
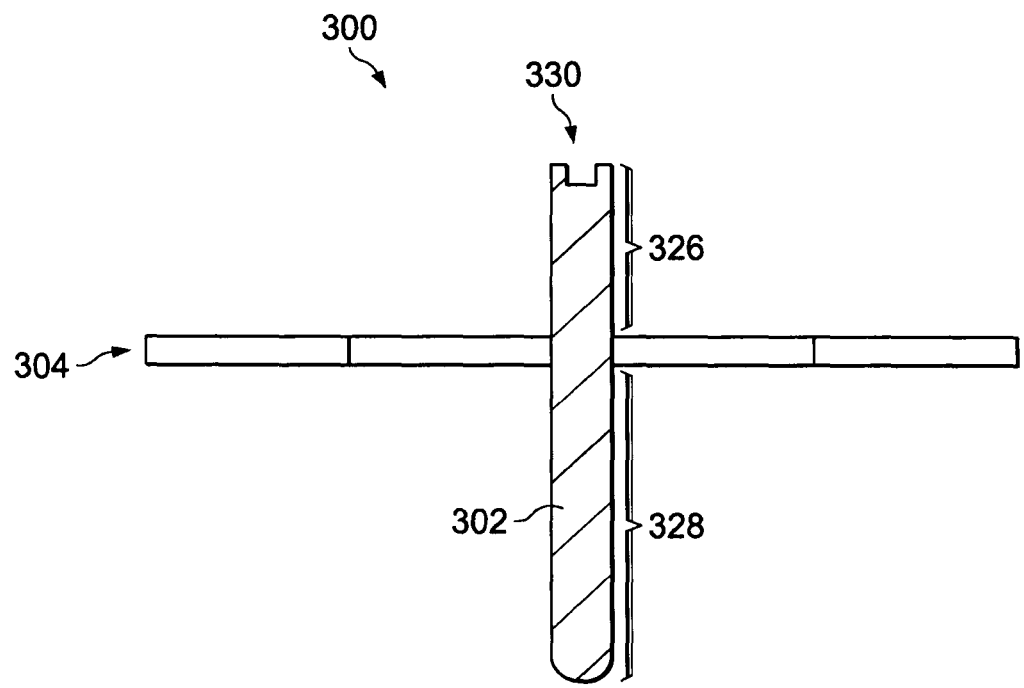
FIG. 3B illustrates a first cross-sectional view of FIG. 3A.
Figure 3C:
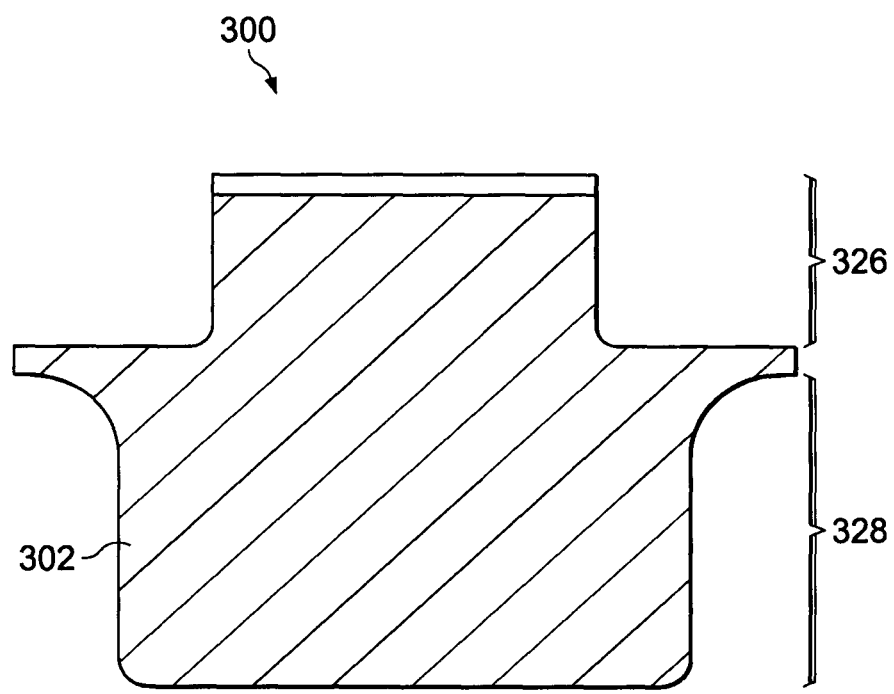
FIG. 3C illustrates a second cross-sectional view of FIG. 3A.

FIG. 3A illustrates a plan top view of UHV leadbacker 300, and FIGS. 3B and 3C illustrate different cross-sectional views of FIG. 3A. UHV leadbacker 300 may be formed from various materials, including as examples those set forth above with respect to slab 200 (e.g., PEEK, DELRIN, TORLON). From the plan view of FIG. 3A or the cross-sectional view of FIG. 3B, the above-introduced vertical charge separation wall 302 (also, FIG. 3C) is generally perpendicular to a material plane 304 (the plane being along the page in FIG. 3A). Material plane 304 has a generally rounded corner rectangular outer perimeter, with a width W4=2.0 inches and a length L5=1.795 inches. Material plane 304 includes a first connecting region 306 and a second connection region 308, separated from one another by a first joining region 310. When material plane 304 is affixed relative to slab 200 (e.g., FIG. 1D), first joining region 310 traverses longitudinal slab axis 210, so that one of first connection region 306 or second connection region 308 may be affixed to a first portion of slab 200 on one side of slab longitudinal axis 210, while the other of first connection region 306 or second connection region 308 may be affixed to a second portion of slab 200, on the other side of slab longitudinal axis 210; accordingly, first joining region 310 bridges the air gap provided by the aperture of central wider portion 218. Similarly, material plane 304 also includes a third connecting region 312 and a fourth connection region 314, separated from one another by a second joining region 316. Accordingly, when material plane 304 is affixed relative to slab 200, second joining region 316 traverses slab longitudinal axis 210 and the air gap of central wider portion 218, so that one of third connection region 312 or fourth connection region 314 may be affixed to a first portion of slab 200 on one side of slab longitudinal axis 210, while the other of third connection region 312 or fourth connection region 314 may be affixed to a second portion of slab 200, on the other side of slab longitudinal axis 210. Each connecting region 306, 308, 312, and 314 includes a respective hole 318, 320, 322, and 324. As introduced above, screws 158_1, 158_2, 158_3, and 158_4 (FIG. 1D) pass through respective counterbores on the underside of slab 200, and each such screw engages with, and passes through, a respective one of holes 318, 320, 322, and 324.

The cross-sectional view of FIG. 3B further demonstrates the perpendicular orientation of vertical charge separation wall 302, relative to material plane 304. Accordingly, as appreciated from FIGS. 3B-3C, when material plane 304, as part of UHV leadbacker 300, is affixed to a slab 200, then a first portion 326 of vertical charge separation wall 302 extends 0.438 inches in a first direction (shown upward in FIG. 3B) perpendicularly away from material plane 304, while a second portion 328 of vertical charge separation wall 302 extends 0.787 inches in a second direction (shown downward in FIG. 3B), opposite the first direction, again perpendicularly from material plane 304. Accordingly, the 0.787 inch downward extension of second portion 328 is larger than the 0.438 upward extension of first portion 326. Moreover, the downward extension of second portion 328 and the upward extension of first portion 326 are each sized, respectively, to exceed the extent to which portions of first and second electrode 402 likewise extend below and above slab 200, so that vertical charge separation wall 302 provides a physical barrier around which charge would have to pass for a discharge between the two electrodes 402 and 404. For instance with the downward dimensions shown as examples, the 0.787 inches downward extension of second portion 328 is generally longer than the total depth TD=0.644 inches to which the combination of stem 410 and the lowest portion of wire retaining member 408 extends downward (FIG. 4C). Also for instance with the upward dimensions shown as examples, the 0.438 inches upward extension of first portion 328 is generally longer than the total height HT=0.201 inches to which an electrode upper surface 418 (FIG. 4C) extends above slab 200. Accordingly, vertical charge separation wall 302 effectively lengthens the distance a charge has to flow though to create an arc in the high electric field region between electrodes 402 and 404. Additionally, vertical charge separation wall 302 also extends into a region of lower electric field strength, in this region likelihood of generating a free electron with enough energy to create an arc is significantly lower. First portion 326 also includes a squared notch 330 at its end, and squared notch 330 includes an opening of approximately 0.073 inches wide and 0.058 inches deep. While not shown, a compliant-material (e.g., silicone rubber) member, such as a cylinder, is located within squared notch 330. As an IC is positioned relative to the test site, this cylindrical material contacts the IC, thereby assisting with alignment and isolation.

Figure 4A:
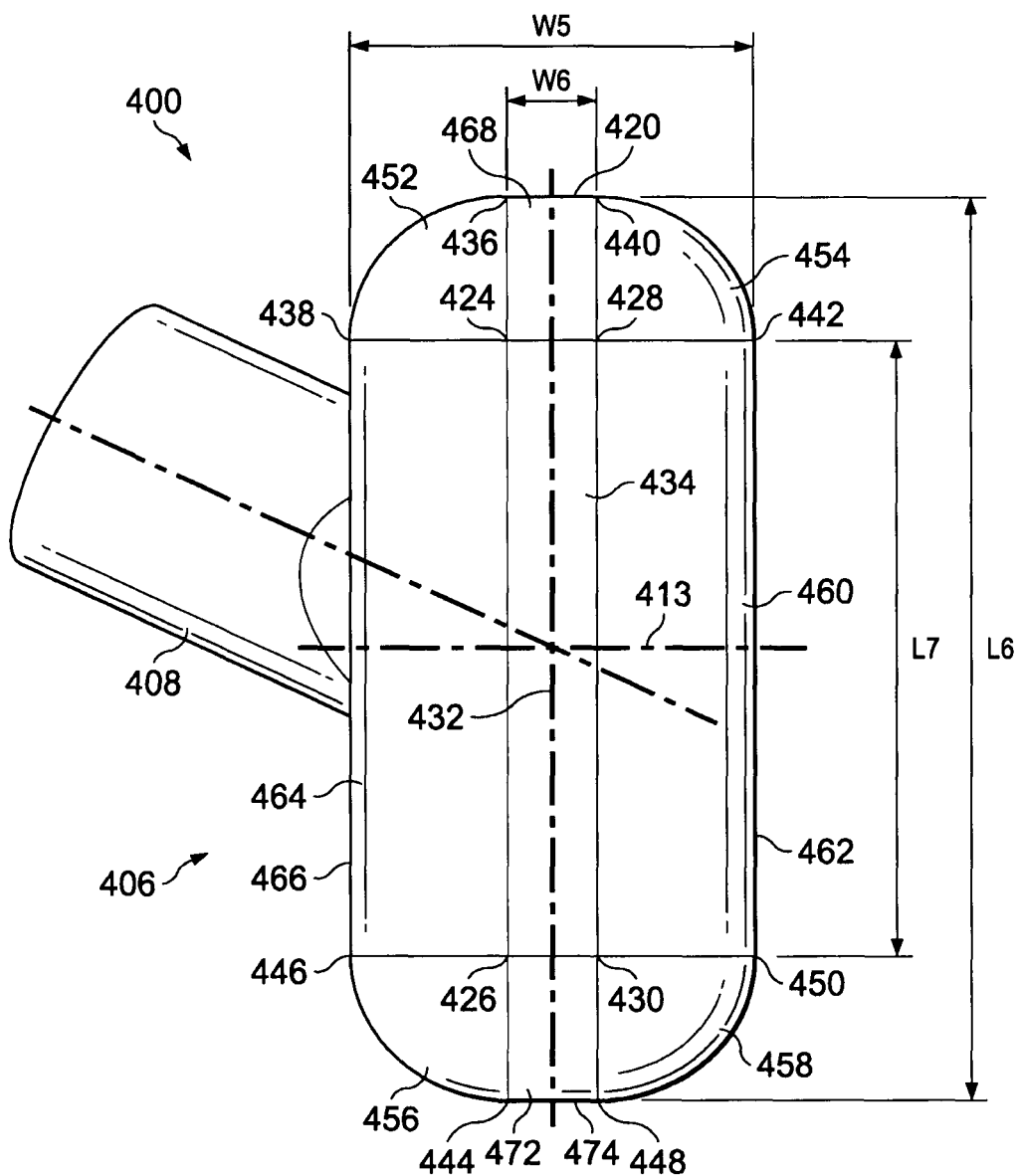
FIG. 4A illustrates a plan top view of an electrode in the FIG. 1A assembly.
Figure 4B:
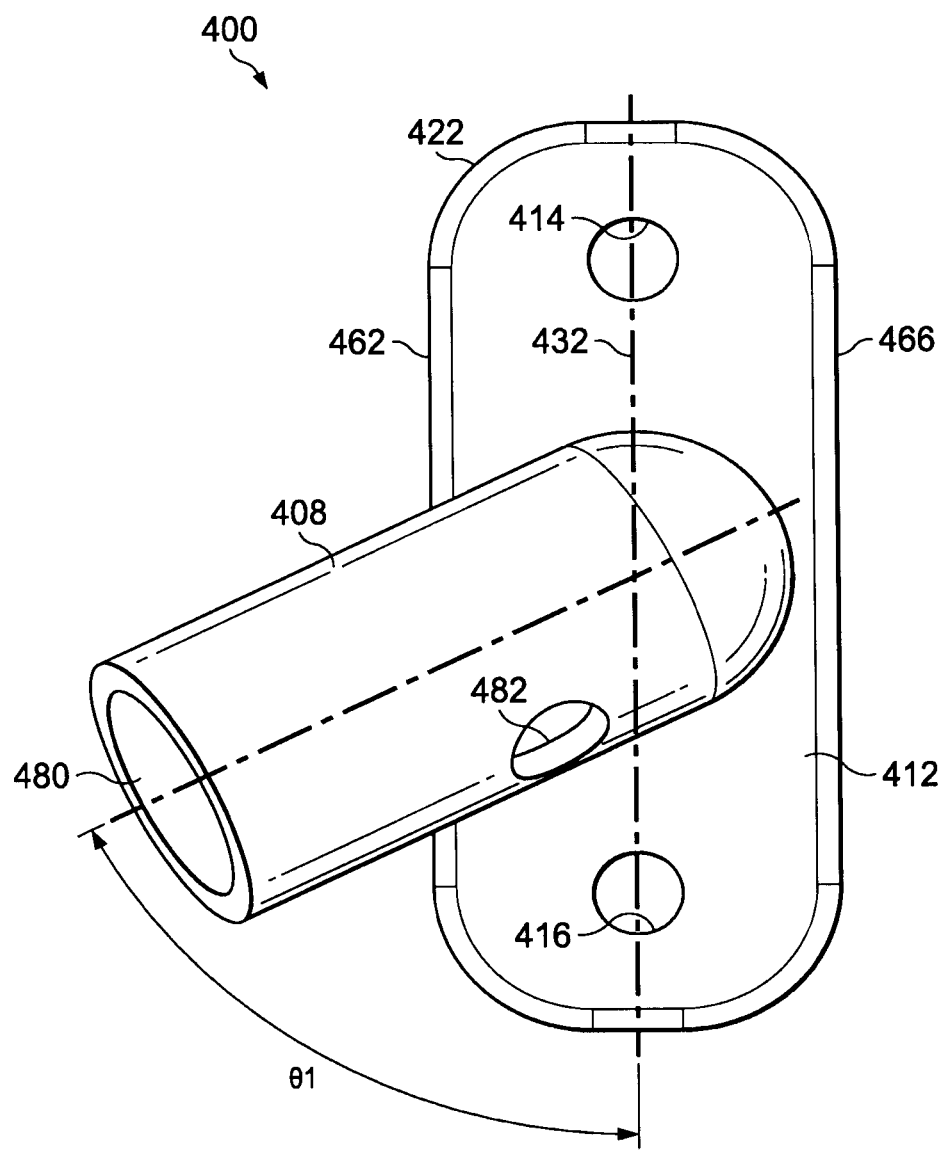
FIG. 4B illustrates a bottom plan view of FIG. 4A.
Figure 4C:
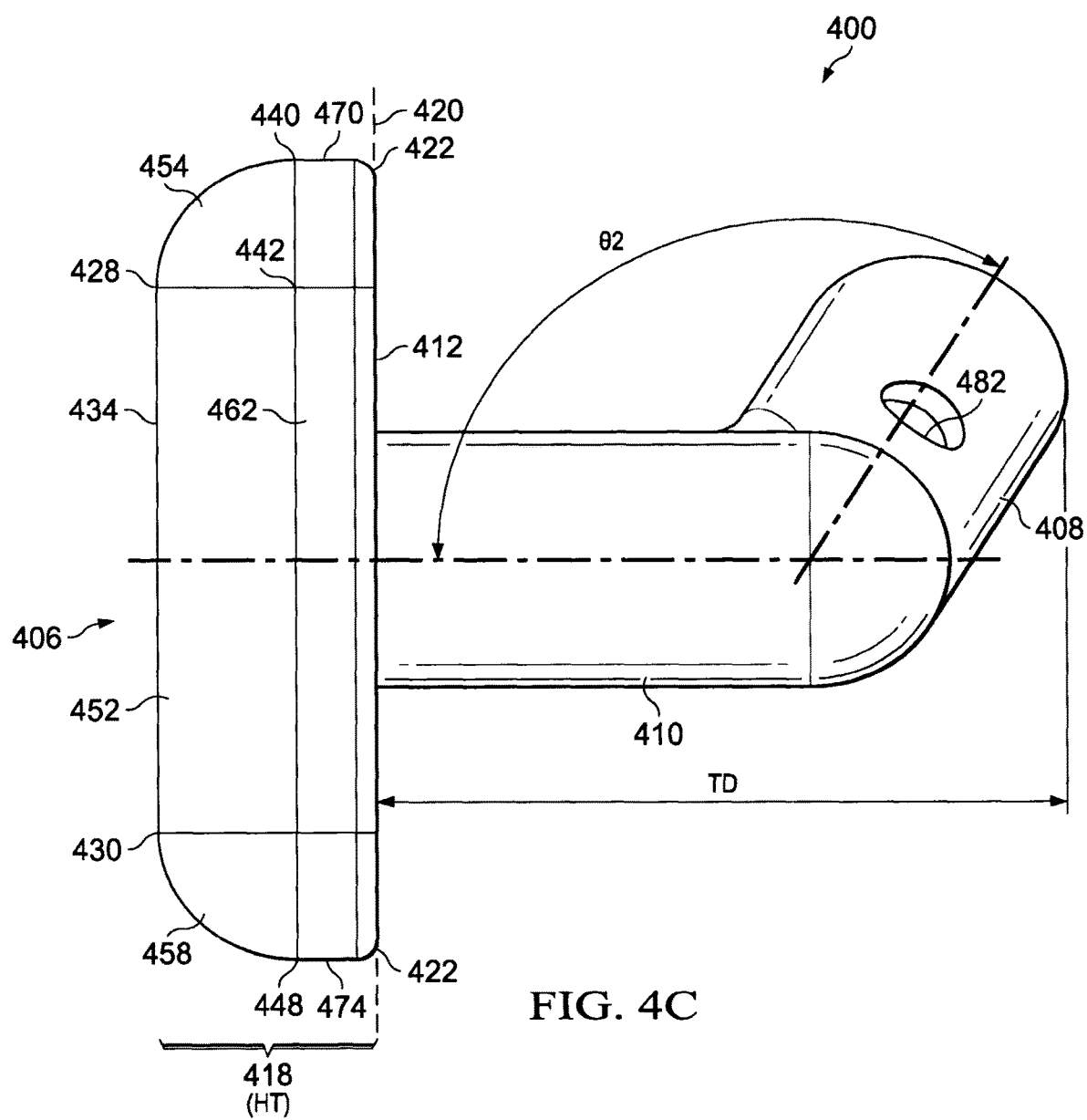
FIG. 4C illustrates a side view, from a right-to-left perspective of FIG. 4A.

FIG. 4A illustrates a plan top view of an electrode 400, which represents either of first electrode 402 or second electrode 404 in earlier Figures, including FIG. 1D. FIG. 4B illustrates a bottom plan view of FIG. 4A, and FIG. 4C illustrates a side view, from a right-to-left perspective of FIG. 4A. Electrode 400 is formed from an electrically conductive material (e.g., metal) and generally includes three portions, namely, upper contactor 406, a wire retaining member 408, and a stem 410 between upper contactor 406 and wire retaining member 408. Generally, a lower surface portion 412 (FIG. 4C) of upper contactor 406 is positioned flush with a first surface (e.g., top) of slab 200, whereby stem 410 passes through an aperture in slab 200 and a portion of stem 410, and also wire retaining member 408, are positioned to an opposite side (e.g., bottom) of slab 200. In one example embodiment, all three portions are formed as a unitary structure, for example by CNC machining. Moreover, the structure also is preferably processed to include as smooth as a surface as feasible (e.g., mirror finish), for example with post-machining polishing to remove any burrs and detectable edges. Further as detailed below, the outer surface of electrode 400, particularly with respect to portions that extend above slab 200 once assembly 100 is assembled, are implemented from geometries that provide smooth surfaces. Smooth surfaces are preferred in an example embodiment at least for surfaces of first electrode 402 or second electrode 404 that face each other once positioned relative to central wider portion 218, to reduce the possibility of higher charge fields on such surfaces. Additionally, smooth surfaces also can be achieved for the remaining portions of first electrode 402 and second electrode 404, particularly on the side (e.g., above in FIG. 1D) slab 200 where IC contact will be accomplished.

Upper contactor 406 has a lower surface portion 412 that is flat and abuts slab 200 when electrode 400 is affixed thereto (e.g., FIG. 1C). Lower surface portion 412 has a length L6=0.780 inches along a major axis 432 of the upper contactor and a width W5=0.315 inches along a minor axis 413 of the upper contactor. Lower surface portion 412 includes a first and second threaded hole 414 and 416, each approximately 0.063 inches in diameter. As introduced above with respect to FIG. 1D, each of screws 160_1 and 160_2, or 160_3 and 160_4 passes through counterbores in the underside of slab 200, and into the underside of electrodes 402 and 404. Note now that the threaded end of each such screw fits into, and engages with, threads on a respective one of threaded holes 414 and 416. Accordingly, tightening such screws in this engagement draws lower surface portion 412 into fixed abutment with an upper surface of slab 200. Further, in one example embodiment, lower surface portion 412 directly abuts the upper surface of slab 200, whereas in an alternative, one or more intermediate structures may be positioned between lower surface portion 412 and slab 200. For example, such structure(s) can add some form of compressibility, so that when an electrode 402 or 404 is contacted by an IC pin(s), an added compressible structure will yield slightly, so as to provide a form of spring-loading, again akin to a pogo pin. In such an alternative approach, however, consideration is given whether the additional structure may diminish testing accuracy.

Upper contactor 406 also has an upper surface 418, identified in FIG. 4C by structure to the left of a plane 420 aligned with lower surface portion 412, that extends for a height HT=0.201 inches away from lower surface portion 412. Upper surface 418 preferably includes no discontinuities (is smooth), so as to mitigate the possibility of higher electric fields (e.g., Coronas) that could occur at such discontinuities. For example, upper surface 418 transitions via a radius 422 with lower surface portion 412, where radius 422 is equal to R.020 inches and extends along the entire perimeter between upper surface 418 and lower surface portion 412. Above this perimeter, upper surface 418 is shown to include a number of planar surfaces, each interfacing with a respective rounded radial structure and with no discontinuity along the respective interface. Various examples of such interfacing surfaces are described below.

In the FIG. 4A perspective, at the uppermost part of upper surface 418 (upward away from the plane of the page), it includes four vertices 424, 426, 428, and 430, where vertices 424 and 426 are on a first side of an imaginary vertical plane along a major axis 432 of, and thereby bisecting, upper contactor 406, and where vertices 428 and 430 are on a second side, opposite the first side, relative to the imaginary vertical plane along major axis 432. Accordingly, within all of vertices 424, 426, 428, and 430 exists a planar upper rectangular surface 434 of upper surface 418, having a width W6=0.079 inches and a length L7=0.544 inches. However, from each of vertices 424, 426, 428, and 430, upper surface 418 extends downward and away radially, at a radius equal to R.118 inches, until the radial extension reaches a respective plane along either of a side or end of upper surface 418. For example, with respect to vertex 424, the R.118 inch radius away from vertex 424, along the contactor major axis, terminates at a vertex 436, while that same R.118 inch radius away from vertex 424, along minor axis 413, terminates at a vertex 438. As another example, with respect to vertex 428, the R.118 inch radius away from vertex 428, along the contactor major axis, terminates at a vertex 440, while that same radius R.118 inch away from vertex 428, along minor axis 413, terminates at a vertex 442. These vertex-to-vertex radial transitions, as the others extending from planar upper rectangular surface 434, are summarized in the following Table 1:

TABLE 1

| Vertex (planar upper rectangular surface 434) | Vertex extending radially along major axis 432 | Vertex extending radially along minor axis 413 |
|---|---|---|
| 424 | 436 | 438 |
| 428 | 440 | 442 |
| 426 | 444 | 446 |
| 430 | 448 | 450 |

The same radius R.118 inch described above is implemented not only in the direction of major and minor axes, but in between, thereby creating upper contoured corners at each of the four upper corners of upper contactor 406. Each such upper contoured corner may be defined from a vertex in the first column of Table 1, to a radius R.118 inch line between the vertices in the corresponding row of the second and third columns in Table 1. For example, consider the first numeric row in Table 1. From vertex 424, a radius R.118 inch extends to each of vertices 436 and 438, shown on the top left corner of FIG. 4A. A same radius R.118 inch extends between those latter two vertices 436 and 438, whereby therefore a first contoured corner 452 is provided between all three vertices, which due to the common radii is essentially defining a one-eighth sphere outer shape for first contoured corner 452. Similarly, for each remaining row in Table 1, a second contoured corner 454 is provided between all three vertices 428, 440, and 442, a third contoured corner 456 is provided between all three vertices 426, 444, and 446, and a fourth contoured corner 458 is provided between all three vertices 430, 448, 450.

Interfacing between a planar surface and a radial surface in upper contactor 406 also occurs, in addition to corners as describe above, along the majority length edges of planar upper rectangular surface 434. For example, consider the edge of planar upper rectangular surface 434 between a first set of its majority-length opposing vertices 428 and 430. From that edge, and in the direction away from the imaginary vertical plane along a major axis 432 (left-to-right in FIG. 4A), upper contactor 406 includes a first majority-length radially contoured surface 460, which terminates along the top of a first majority-length sidewall plane 462 (FIG. 4C). Similarly, from the edge between a second set of majority length opposing vertices 424 and 426, and in the direction away from the imaginary vertical plane along a major axis 432 (right-to-left in FIG. 4A), upper contactor 406 includes a second majority-length radially contoured surface 464, which terminates along the top of a second majority-length sidewall plane 466. The bottom of each of first majority-length sidewall plane 462 and second majority-length sidewall plane 466 interfaces with radius 422 which, as introduced above, extends around the lower perimeter of upper contactor 406, as an interface to lower surface portion 412.

Interfacing between a planar surface and a radial surface in upper contactor 406 also occurs along the minority length edges of planar upper rectangular surface 434. For example, consider the edge of planar upper rectangular surface 434 between a first set of its minority-length opposing vertices 424 and 428. From that edge away and in the direction toward a first minority length end of upper contactor 406 (upward in FIG. 4A), upper contactor 406 includes a first minority-length radially contoured surface 468, which terminates along the top of a first minority-length sidewall plane 470. Similarly, from the edge of planar upper rectangular surface 434, between a second set of minority length opposing vertices 426 and 430, and in the direction toward a second minority length end of upper contactor 406 (downward in FIG. 4A), upper contactor 406 includes a second minority-length radially contoured surface 472, which terminates along the top of a second minority-length sidewall plane 474. The bottom of each of first minority-length sidewall plane 470 and second minority-length sidewall plane 474 also interfaces with radius 422.

Figure 4D:
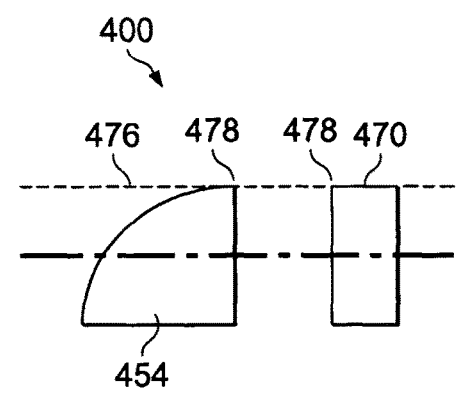
FIG. 4D illustrates a co-linear relationship of surfaces in FIGS. 4A-4C.

From the preceding, an illustrated example electrode embodiment includes a contactor portion, above slab 200, that has no surface discontinuities, that is, no sharp or distinct break in the physical surface continuity. For example, upper contactor 406 includes a first radius interfacing with an edge of an upper plane (planar upper rectangular surface 434) and a second radius, smaller than the first radius, interfacing with a lower plane (lower surface portion 412). At each plane edge/radius interface, the linear outer surface of a planar surface is co-linear with a tangent to the outer surface of a radial surface. For example, FIG. 4D illustrates the described co-linear relationship, by illustrating, in exploded view, an outline of second contoured corner 454 and first minority-length sidewall plane 470, from FIG. 4C. With respect to second contoured corner 454, a tangent line 476 is shown at interface point 478, where interface point 478 is shown twice to represent the point where second contoured corner 454 and first minority-length sidewall plane 470 meet in FIG. 4C. In the exploded view of FIG. 4D, tangent line 476 is drawn at interface point 478 in the orientation as would be defined for a tangent line, relative to the contour, were it a full circle. Accordingly, tangent line 476, at interface 478, is co-linear with the planar edge of first minority-length sidewall plane 470. This geometric relationship creates the lack of a discontinuity at interface 478. Moreover, because this same physical relationship exists along numerous other interfaces of upper contactor 406, it therefore does not include surface discontinuities, as introduced earlier.

FIGS. 4B and 4C also illustrate stem 410 and wire retaining member 408 of electrode 400. Stem 410 may be a solid cylinder, for example having a length of 0.440 inches and a diameter of 0.250 inches. Wire retaining member 408 may provide a receptacle that includes a partially hollow cylinder with an outer diameter of 0.250 inches, and on one end an opening 480, for receiving a sheathed wire. With both stem 410 and wire retaining member 408 having outer cylindrical surfaces, those surfaces also present with little or no discontinuities, again reducing the possibility of charge accumulating that could aggregate at points along the surface. The interior of wire retaining member 408 may include a counterbore, so that opening 480 has a first inner diameter of 0.188 inches to receive the wire sheath, and deeper within opening 480 is a second inner diameter of 0.098 inches, to receive the wire protruding from a stripped end of the sheath. Wire retaining member 408 also includes a threaded set screw hole 482 for receiving a separate set screw (not shown), whereby once the sheathing of the stripped wire is inserted into an open end of wire retaining member 408, the set screw is rotated into threaded set screw hole 482 so as to trap the exposed end of the stripped wire into wire retaining member 408. In this regard, an electrical signal (e.g., voltage) can be passed via the wire into the entire conductive body of electrode 400. Returning to stem 410, recall that slab 200 includes a first cutout 220 and a second cutout 222 (FIG. 2A), where each cutout provides an area through which a portion of a respective first electrode 402 or second electrode 404 (FIG. 1D) passes; the electrode pass through portion, as now will be appreciated, is stem 410. Accordingly, when electrode 400 is to be affixed relative to slab 200, electrode 400 is manipulated so that stem 410 fits within a respective cutout 220 or 222. Thereafter, each of screws 160_1 and 160_2, or 160_3 and 160_4, is affixed through slab 200 to holes 414 and 416 as described above, thereby positioning wire retaining member 408 beneath slab 200. Further, as shown in FIG. 4B, wire retaining member 408 is formed at an angle θ1 (e.g., θ1=116 degrees) relative to an imaginary vertical plane along a major axis 432. Accordingly, when electrode 400 is assembled to slab 200, wire retaining member 408 is directed away from imaginary longitudinal slab axis 210 of slab 200 (FIG. 2A). This directing away of a wire retaining member 408 may be used advantageously in a pair of electrodes 400, such as shown partially in FIG. 1D, where electrode 400 is embodied in each of first electrode 402 and second electrode 404. As shown in that orientation, a wire retaining member 408 of first electrode 402 is oriented generally toward a 10 o'clock position relative to imaginary longitudinal slab axis 210, while a wire retaining member 408 of second electrode 404 is oriented 180 degrees in the opposite direction, that is, generally toward a 4 o'clock position relative to imaginary longitudinal slab axis 210. As shown in FIG. 4C, note also that wire retaining member 408 also may be angled downward at an angle θ2 greater than 90 degrees relative to stem 410, for example with θ2=121 degrees. Lastly, the combination, of stem 410 and the lowest portion of wire retaining member 408, extends downward a total depth TD=0.644 inches relative to lower surface portion 412.

Figure 5A:
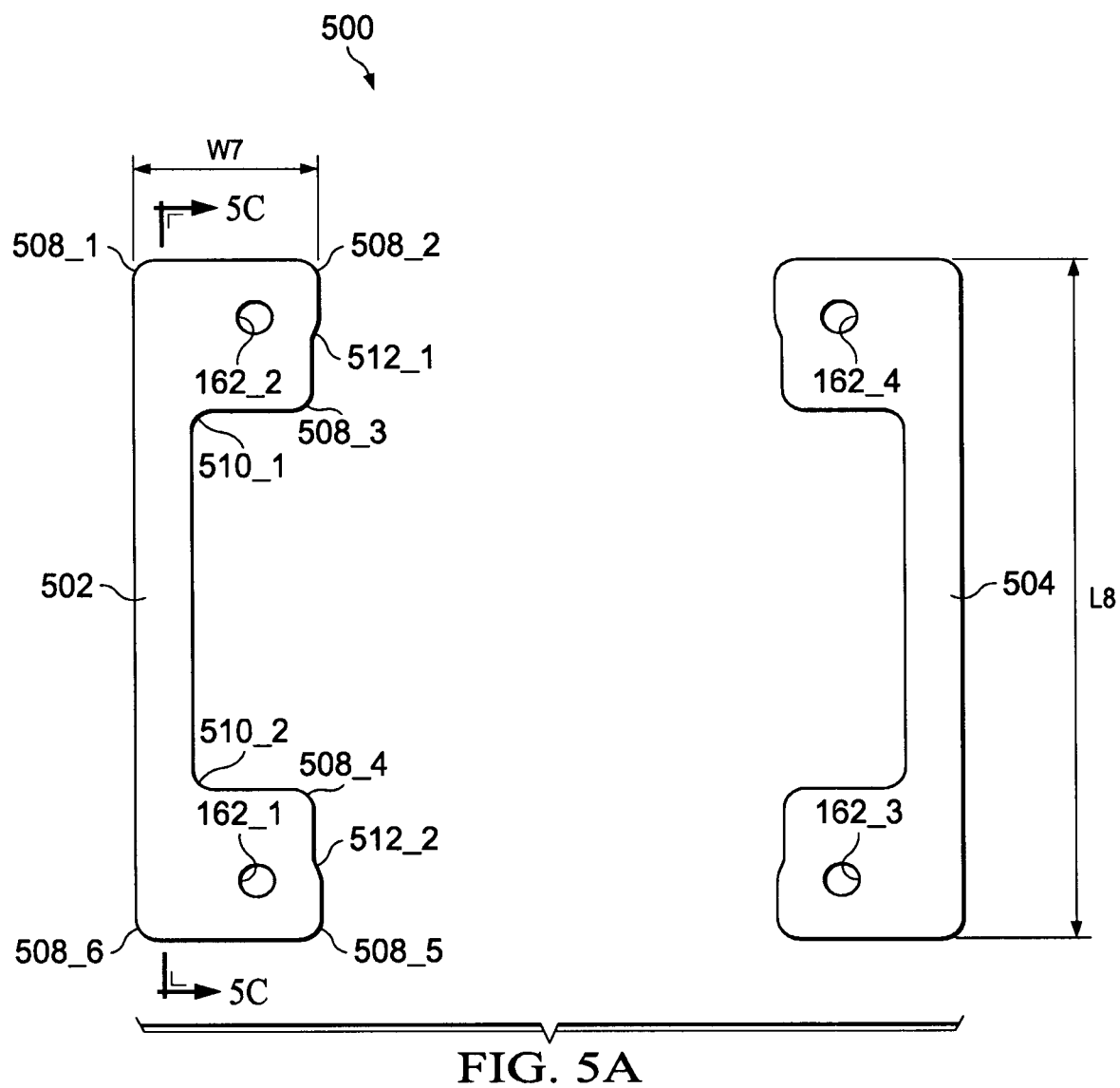
FIG. 5A illustrate a top plan view of a two-piece UHV contactor shim in the FIG. 1A assembly.
Figure 5B:
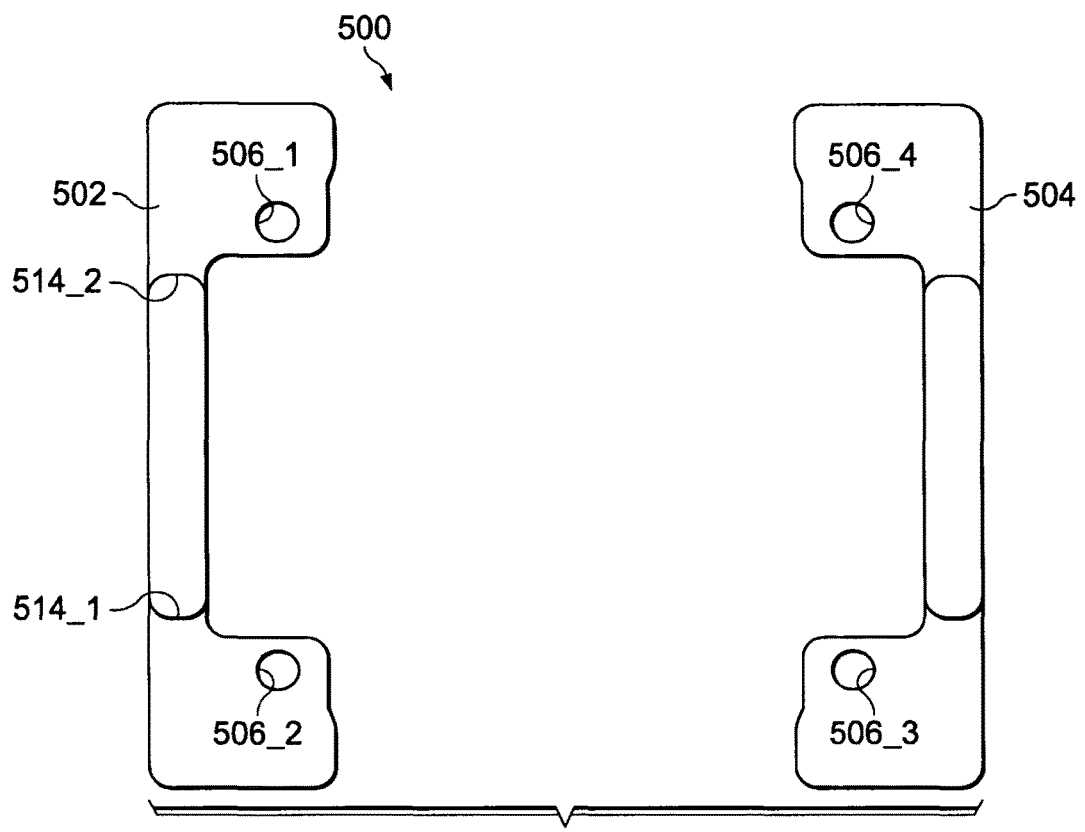
FIG. 5B illustrates a bottom plan view of FIG. 5A.
Figure 5C:
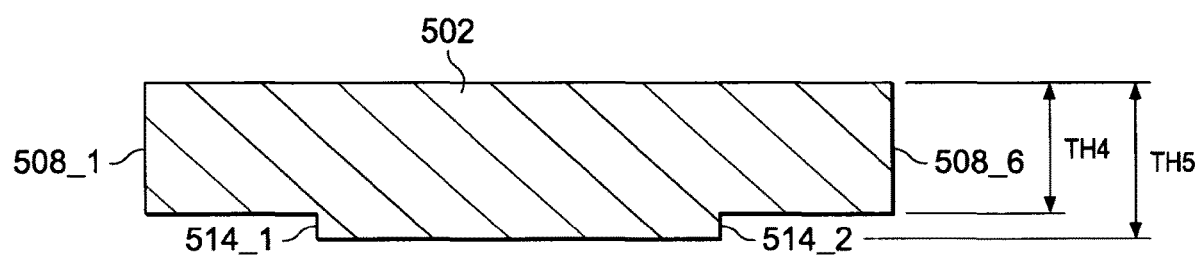
FIG. 5C illustrates a cross-sectional view of FIG. 5A.

FIGS. 5A-5C illustrate two-piece UHV contactor shim 500, with FIG. 5A as a top plan view, FIG. 5B as a bottom plan view, and FIG. 5C as a cross-sectional view. UHV contactor shim 500 may be formed from various materials, including as examples those set forth above with respect to slab 200 (e.g., PEEK, DELRIN, TORLON). As introduced earlier, UHV contactor shim 500 includes first piece 502 and second piece 504. First piece 502 and second piece 504 are mirror images of one other, and each generally has a C-shape from top or bottom perspective, with a maximum length L8=1.795 inches and a maximum width W7=0.461 inches. Surface corners, from and between top and bottom perspectives, are rounded without discontinuity, for example with first piece 502 including respective rounded outer corners 508_1, 508_2, 508_3, 508_4, 508_5, and 508_6, and rounded inner corners 510_1 and 510_2, all with a radius of R.020 inches. First piece 502 (and symmetrically, second piece 504) also includes respective rounded recessed corners 512_1 and 512_2, each with a radius of R.039 inches.

Each of first piece 502 and second piece 504 includes a first set of holes on its upper surface, and a second set of holes on its lower surface. Thus, shown in FIG. 5A, each of first piece 502 and second piece 504 has a set of four holes 162_1, 162_2, 162_3, and 162_4 on its upper surface. Each upper surface hole is approximately 0.152 inches from a closest end of the piece. Each of holes 162_1, 162_2, 162_3, and 162_4 may be threaded to receive a respective screw, or unthreaded to receive a pin, and each hole also is preferably only a partial depth (e.g., 0.250 inches) down from the upper surface of either first piece 502 or piece 504. Each of holes 162_1, 162_2, 162_3, and 162_4 is for cooperating with a pin or screw of a handler (not shown), as described earlier. Further, as shown in FIG. 5B, each of first piece 502 and second piece 504 also has a set of four threaded holes 506_1, 506_2, 506_3, and 506_4 on its lower surface. Each lower surface hole is approximately 0.307 inches from a closest end of the piece. Each of holes 506_1, 506_2, 506_3, and 506_4 is preferably only a partial depth (e.g., 0.165 inches) up from the lower surface of either first piece 502 or piece 504. Each of holes 506_1, 506_2, 506_3, and 506_4 cooperates with a respective one of screws 158_1, 158_2, 158_3, and 158_4, described earlier in connection with FIG. 1D.

FIG. 5C illustrates additional cross-sectional aspects of UHV contactor shim 500, also appreciable in part from the lower plan view of FIG. 5B. Each of pieces 502 or 504 includes, toward its respective C-shaped ends, a first thickness TH4=0.335 inches, and toward its middle has a second thickness TH5=0.413 inches. The thicker middle portion has rounded ends 514_1 and 514_2, each with a radius of R.039 inches.

From the above, one skilled in the art should appreciate that example embodiments include an HV IC testing interface assembly, which now having been described in various details can be further appreciated with reference to FIG. 1C and FIG. 1A. As shown in FIG. 1C, the described apparatus cumulatively provide an IC landing area 156, so that an IC may be positioned with a first set of its pins, typically along a first side of the IC, in physical and electrical contact with a first electrode 402 and with a second set of its pins, typically along a second side of the IC, in in physical and electrical contact with a second electrode 404. The IC is likely brought into such position by other electromechanical apparatus obtainable in the art (such as a handler), and such apparatus has a surface that will contact/dock with the upper surface of two-piece UHV contactor shim 500, so as to ensure proper alignment in each dimension. A first wire (not shown) is connected to first electrode 402 and a second wire (not shown) is connected to first electrode 404, and thereafter an HV differential voltage is applied, via the connected wires, by applying a first voltage to first electrode 402 and a second voltage to second electrode 404.

Figure 6:
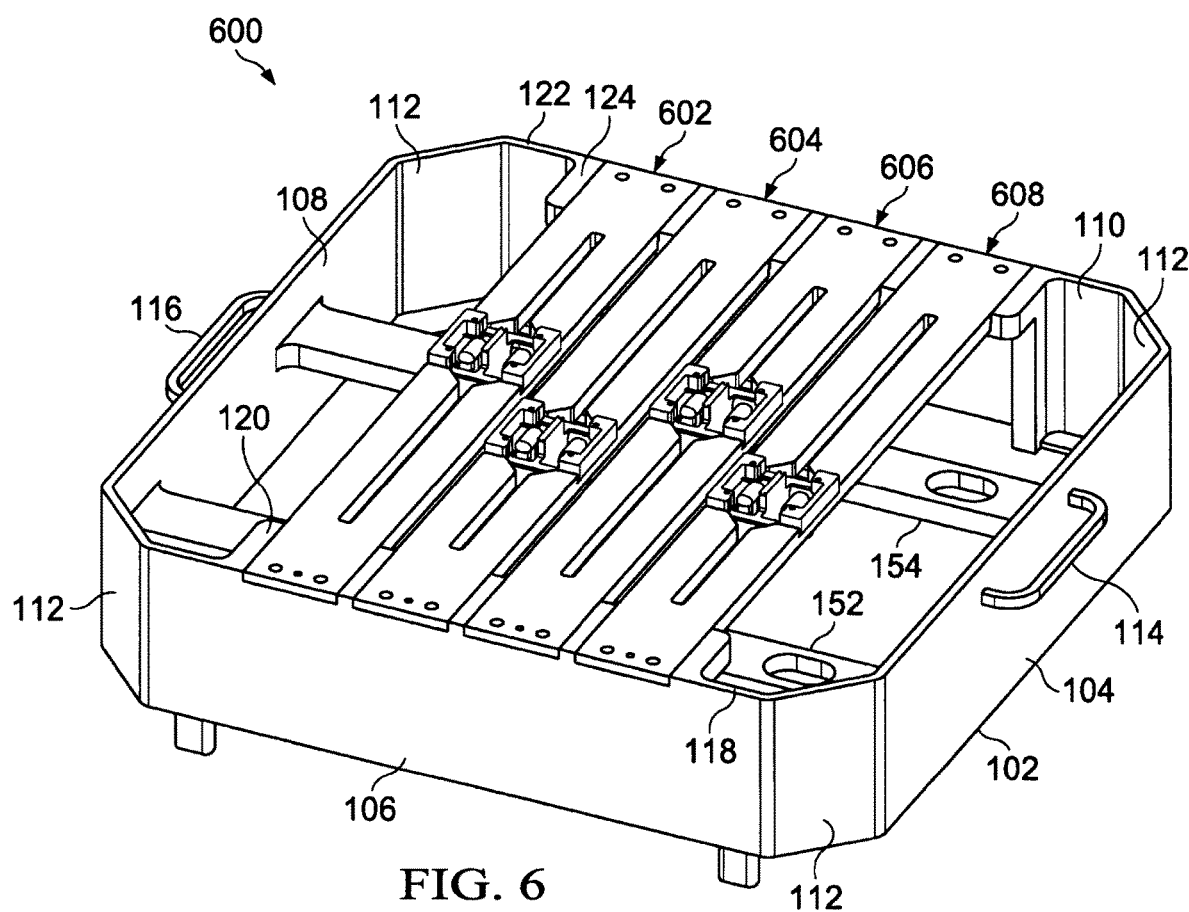
FIG. 6 illustrates a perspective view of an alternative embodiment high voltage integrated circuit testing interface assembly.

With the various attributes described above, the applied HV differential voltage is connected to the IC, but with a reduced chance of test error that might arise from either partial discharge or a full arc occurring outside of the IC, that is, between other parts of the testing architecture. Indeed, with the illustrated embodiments, higher test voltages (between the electrodes) may be applied without resulting in false fails, that otherwise might occur in the prior art due to a test board causing partial discharge or arcing. The reduced test error can be attributed to various aspects of the illustrated example embodiment, including but not limited to apparatus size, shape, geometry, material, and location. For example, the surfaces of upper contactor 406 are formed to reduce or eliminate surface discontinuities. This surface implementation may be more desirable for the surface portions of first electrode 402 and second electrode 404 that are closer to one another, for example the inward facing sides of those two structures. In one manner of defining a portion of each of first electrode 402 and second electrode 404 to have a surface without discontinuities, recall the defined imaginary vertical plane along a major axis 432 bisecting each electrode; accordingly, in one example embodiment, the surface of each electrode, from that electrode-bisecting plane facing toward the electrode-bisecting plane of the other electrode, has minimal or no discontinuities, thereby reducing accumulated charge along the surface that could discharge or arc between the electrodes. Of course, in another example embodiment, the entire upper surface of each of first and second electrodes 402 and 404 can be desirably formed with little or no discontinuities. Still other portions of the upper contactor 406 of each electrode can be without discontinuities, as may portions of the electrode that extend through and below each slab 200 (e.g., one or both of stem 410 or wire retaining member 408). Reduction of potential partial discharge or arcing also may be achieved through additional structural isolation, such as by vertical charge separation wall 302 extending either above or below slab 200, or both, and between first and second electrodes 402 and 404 the like. Moreover, while FIG. 1C illustrates a single landing area 156 for a corresponding single IC site test, FIG. 1A illustrates multiple (e.g., four) such sites, each in connection with a respective slab 202, 204, 206, and 208, with an air gap between each such slab. The air gap is parallel to the major axis of each slab and is preferably a width sufficient to accommodate distance between each IC when located in a respective site. The air gap thus provides another charge barrier, arising from the dielectric difference between successively positioned slabs and air between them, further reducing the chance for undesirable partial discharge or arcing. Still further, with multiple test sites, each test site can concurrently receive and then test a respective IC, that is, one IC can be positioned in each respective test site, followed by a different voltage applied to the IC at each test site. Moreover, test site location may be adjusted per slab. For example, FIG. 1A illustrates each test site (landing area) at a same relative position between the ends of the slab on which the test site is located. However, in alternative embodiment, each test site, per slab, may be moved relative to the slab ends, for example as shown in an alternative HV integrated circuit testing interface assembly 600 in FIG. 6. Specifically, assembly 600 includes four slabs 602, 604, 606, and 608, and for each slab, its test site is positioned at a different position between the slab ends, relative to a least one neighboring slab, for example as shown with slab 602 relative to slab 604. Further, when a given slab has a neighboring slab on both of its sides (e.g., slab 604, relative to slab 602 and 606), then the given slab may have its test site positioned at a different position between the slab ends, relative to both neighboring slabs. Thus, whereas in FIG. 1A, each test site is at a same position per slab and collectively the test sites are thereby aligned in a line, in FIG. 6, each test site is a different position, for example, symmetrically so that every-other test site is in a same position, thereby aligning in a checkerboard arrangement. Further, while the above-described attributes are shown in combination, the inventive scope includes subsets of one or more features in other embodiments. Still further, also contemplated are changes in various parameters, including dimensions, with the preceding providing only some examples, with others ascertainable, from the teachings herein, by one skilled in the art. Accordingly, additional modifications are possible in the described embodiments, and other embodiments are possible, within the scope of the following claims.

What is claimed is:

1. An integrated circuit testing interface assembly, comprising:
   a slab having a slab axis aligned along a first plane;
   a first electrode affixed relative to the slab and having a first major axis parallel to the slab axis, the first electrode coupled to receive a first voltage, and the first electrode including a first surface area facing the slab axis, wherein the first surface area does not include a surface discontinuity;
   a second electrode affixed relative to the slab and having a second major axis parallel to the slab axis, the second electrode coupled to receive a second voltage, differing from the first voltage, and the second electrode including a second surface area facing the slab axis, wherein the second surface area does not include a surface discontinuity, and wherein the first surface area and the second surface area are affixed relative to a same surface of the slab and
   a charge separation wall perpendicular to the first plane and extending in a direction away from the same surface of the slab and between the first surface area and the second surface area.

2. The integrated circuit testing interface assembly of claim 1, wherein the first surface area and the second surface area are affixed relative to a same surface of the slab.

3. The integrated circuit testing interface assembly of claim 1,
   wherein the charge separation wall further extends in a second direction opposite from the direction.

4. The integrated circuit testing interface assembly of claim 1:
   wherein the first electrode includes a first total surface extending away from a surface of the slab, the first total surface including the first surface area facing the slab axis, and wherein the first total surface does not include a surface discontinuity; and
   wherein the second electrode includes a second total surface extending away from a surface of the slab, the second total surface including the second surface area facing the slab axis, and wherein the second total surface does not include a surface discontinuity.

5. The integrated circuit testing interface assembly of claim 1 and further comprising:
- at least one first mechanical fastener affixing the first electrode relative to the slab; and
- at least one second mechanical fastener affixing the second electrode relative to the slab.

6. The integrated circuit testing interface assembly of claim 1 and further comprising:
- at least a first screw affixing the first electrode relative to the slab; and
- at least a second screw affixing the second electrode relative to the slab.

7. The integrated circuit testing interface assembly of claim 1 and further comprising:
- a first screw and a second screw affixing the first electrode relative to the slab; and
- a third screw and a fourth screw affixing the second electrode relative to the slab.

8. An integrated circuit testing interface assembly, comprising:
- a slab having a slab axis aligned along a first plane;
- a first electrode affixed relative to the slab and having a first major axis parallel to the slab axis, the first electrode coupled to receive a first voltage, and the first electrode including a first surface area facing the slab axis, wherein the first surface area does not include a surface discontinuity;
- a second electrode affixed relative to the slab and having a second major axis parallel to the slab axis, the second electrode coupled to receive a second voltage, differing from the first voltage, and the second electrode including a second surface area facing the slab axis, wherein the second surface area does not include a surface discontinuity, wherein the first surface area and the second surface area are affixed relative to a same surface of the slab, and wherein the same surface is a first surface of the slab, and the slab includes a second surface opposite the first surface; and
- a charge separation wall perpendicular to the first plane and extending in a direction away from the second surface.

9. An integrated circuit testing interface assembly, comprising:
- a slab having a slab axis;
- a first electrode affixed relative to the slab and having a first major axis parallel to the slab axis, the first electrode coupled to receive a first voltage, and the first electrode including a first surface area facing the slab axis, wherein the first surface area does not include a surface discontinuity; and
- a second electrode affixed relative to the slab and having a second major axis parallel to the slab axis, the second electrode coupled to receive a second voltage, differing from the first voltage, and the second electrode including a second surface area facing the slab axis, wherein the second surface area does not include a surface discontinuity, and wherein the slab includes an aperture between a portion of the first electrode and a portion of the second electrode.

10. The integrated circuit testing interface assembly of claim 9:
- wherein the first electrode further includes a first stem passing through the aperture; and
- wherein the second electrode further includes a second stem passing through the aperture.

11. The integrated circuit testing interface assembly of claim 10:
- wherein the first electrode further includes a first wire retaining member coupled to the first stem; and
- wherein the second electrode further includes a second wire retaining member coupled to the second stem.

12. The integrated circuit testing interface assembly of claim 9 and further comprising a charge separation wall perpendicular to the slab axis and extending through the aperture.

13. The integrated circuit testing interface assembly of claim 9 and further comprising:
- a frame; and
- a plurality of integrated circuit test sites coupled to the frame;
- wherein each test site in the plurality of integrated circuit test sites includes a respective slab and a respective pair of electrodes; and
- wherein one test site in the plurality of integrated circuit test sites includes the slab and a first pair of electrodes, the first pair of electrodes including the first electrode and the second electrode.

14. The integrated circuit testing interface assembly of claim 13 wherein each respective slab is affixed relative to the frame with an air gap between the respective slab and another respective slab affixed relative to the frame.

15. The integrated circuit testing interface assembly of claim 13 wherein each respective pair of electrodes of a respective integrated circuit test site comprises:
- one electrode affixed relative to a slab of the respective integrated circuit test site and having a major axis parallel to a slab axis of the slab of the respective integrated circuit test site, the one electrode coupled to receive one voltage for coupling to a first set of pins a respective integrated circuit, and the one electrode including a surface area facing the slab axis of the slab of the respective integrated circuit test site, wherein the surface area of the one electrode does not include a surface discontinuity; and
- another electrode affixed relative to the slab of the respective integrated circuit test site and having a major axis parallel to the slab axis of the slab of the respective integrated circuit test site, the another electrode coupled to receive another voltage for coupling to a second set of pins a respective integrated circuit, and the another electrode including a surface area facing the slab axis of the slab of the respective integrated circuit test site, wherein the surface area of the another electrode does not include a surface discontinuity.

16. The integrated circuit testing interface assembly of claim 13 wherein each respective slab in each integrated circuit test site includes an aperture between the respective pair of electrodes of the respective integrated circuit test site.

17. The integrated circuit testing interface assembly of claim 16 wherein each respective integrated circuit test site includes a charge separation wall extending perpendicularly relative to the respective slab of the respective test site and between the respective pair of electrodes of the respective integrated circuit test site.

18. The integrated circuit testing interface assembly of claim 13 wherein each test site is positioned at a same relative position between a first end and a second end of a respective slab.

19. The integrated circuit testing interface assembly of claim 13:
- wherein a first test site is positioned at a first relative position between a first end and a second end of a first respective slab;

wherein a second test site is positioned at a second relative position, differing from the first relative position, between a first end and a second end of a second respective slab that is neighboring to the first respective slab.

20. The integrated circuit testing interface assembly of claim 19 wherein a third test site is positioned at a third relative position, differing from the second relative position, between a first end and a second end of a third respective slab that is neighboring to the second respective slab.

21. The integrated circuit testing interface assembly of claim 20 wherein the third relative position is the same as the first relative position.

22. An integrated circuit testing interface assembly, comprising:
   a slab having a slab axis;
   a first electrode affixed relative to the slab and having a first major axis parallel to the slab axis, the first electrode coupled to receive a first voltage, and the first electrode including a first surface area facing the slab axis, wherein the first surface area does not include a surface discontinuity; and
   a second electrode affixed relative to the slab and having a second major axis parallel to the slab axis, the second electrode coupled to receive a second voltage, differing from the first voltage, and the second electrode including a second surface area facing the slab axis, wherein the second surface area does not include a surface discontinuity, and wherein at least one of the first electrode and the second electrode has a contact surface that includes a one-eighth sphere outer surface area at each of four respective corners.

23. The integrated circuit testing interface assembly of claim 22 wherein each of the first electrode and the second electrode has a contact surface that includes a one-eighth sphere outer surface area at each of four respective corners.

* * * * *